United States Patent
Batra et al.

(10) Patent No.: US 6,909,196 B2
(45) Date of Patent: Jun. 21, 2005

(54) METHOD AND STRUCTURES FOR REDUCED PARASITIC CAPACITANCE IN INTEGRATED CIRCUIT METALLIZATIONS

(75) Inventors: Shubneesh Batra, Boise, ID (US); Michael D. Chaine, Boise, ID (US); Brent Keeth, Boise, ID (US); Salman Akram, Boise, ID (US); Troy A. Manning, Meridian, ID (US); Brian Johnson, Boise, ID (US); Chris G. Martin, Boise, ID (US); Todd A. Merritt, Boise, ID (US); Eric J. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 10/178,172

(22) Filed: Jun. 21, 2002

(65) Prior Publication Data

US 2003/0234448 A1 Dec. 25, 2003

(51) Int. Cl.$^7$ .................. H01L 23/48; H01L 23/52; H01L 29/40
(52) U.S. Cl. .................. 257/781; 257/781; 257/784; 257/786; 257/774; 257/780; 257/503; 257/758; 438/612
(58) Field of Search ................ 257/781, 784, 257/786, 774, 780, 503, 758, 773, 782; 438/612

(56) References Cited

U.S. PATENT DOCUMENTS

| | | | | |
|---|---|---|---|---|
| 5,288,661 A | | 2/1994 | Satoh et al. ................. | 438/449 |
| 5,502,337 A | | 3/1996 | Nozaki ........................ | 257/773 |
| 5,700,735 A | | 12/1997 | Shiue et al. ................. | 438/612 |
| 5,736,791 A | | 4/1998 | Fujiki et al. ................. | 257/781 |
| 5,880,529 A | | 3/1999 | Barrow ........................ | 257/782 |
| 6,143,396 A | | 11/2000 | Saran et al. ................. | 428/162 |
| 6,207,547 B1 | | 3/2001 | Chittipeddi et al. ........ | 438/612 |
| 6,313,537 B1 | * | 11/2001 | Lee et al. .................... | 257/758 |
| 6,448,641 B2 | * | 9/2002 | Ker et al. .................... | 257/700 |
| 6,489,228 B1 | * | 12/2002 | Vigna et al. ................. | 438/612 |
| 6,522,021 B2 | * | 2/2003 | Sakihama et al. .......... | 257/784 |
| 2001/0010407 A1 | | 8/2001 | Ker et al. .................... | 257/781 |
| 2002/0043727 A1 | | 4/2002 | Wu ............................. | 257/786 |

FOREIGN PATENT DOCUMENTS

| | | |
|---|---|---|
| EP | 0 875 934 A2 | 11/1998 |
| WO | WO 00/35000 | 6/2000 |

OTHER PUBLICATIONS

Ker, et al., Design on the Low–Capacitance Bond Pad for High–Frequency I/O Circuits in CMOS Technology, IEEE Transactions on Electron Devices, vol. 48, No. 12, Dec. 2001, pp. 2953–2956.

Ching et al., *Bond Pad Structure Reliability,* 1988 IEEE/IRPS, p. 64–70.

* cited by examiner

*Primary Examiner*—George Eckert
*Assistant Examiner*—Chris C. Chu
(74) *Attorney, Agent, or Firm*—Knobbe Martens Olson & Bear LLP

(57) ABSTRACT

A method of reducing parasitic capacitance in an integrated circuit having three or more metal levels is described. The method comprises forming a bond pad at least partially exposed at the top surface of the integrated circuit, forming a metal pad on the metal level below the bond pad and forming an underlying metal pad on each of the one or more lower metal levels. In the illustrated embodiments, the ratio of an area of at least one of the underlying metal pads to the area of the bond pad is less than 30%. Parasitic capacitance is thus greatly reduced and signal propagation speeds improved.

14 Claims, 5 Drawing Sheets

METHOD AND STRUCTURES FOR REDUCED PARASITIC CAPACITANCE IN INTEGRATED CIRCUIT METALLIZATIONS

FIELD OF THE INVENTION

The invention is directed generally to reducing parasitic capacitance in integrated circuits and, more specifically, to a multi-layered bond pad structure and method of forming same that reduces parasitic capacitance for the integrated circuit.

BACKGROUND OF THE INVENTION

In addition to complex device structures, integrated circuits generally comprise conductive elements separated by insulating elements. Such constructions essentially form parallel plate capacitors. Parallel plate capacitance can be described by the well-known equation:

$$C = \frac{k\varepsilon_0 A}{d}, \qquad (1)$$

wherein C is capacitance, k is the dielectric coefficient of the material between the plates, $\varepsilon_0$ is the permittivity of free space, A is the plate area and d is the distance between plates. As feature size continues to decrease and packing density continues to increase, dielectric layers that separate conductive elements, particularly metal layers, become thinner, thus decreasing d in the equation above. As d decreases, capacitance increases.

Pin capacitance is a measure of overall parasitic capacitance within a chip as measured across particular pins in a fully fabricated and packaged integrated circuit. It is desirable to make pin capacitance as low as possible, as an increased level can slow down the transfer of signals to and from the devices on the chip and can increase the power needed to drive the pins. In addition, bus speeds are becoming faster, into the GHz range. To accommodate these higher speeds, pin capacitance requirements, as specified by manufacturers such as Intel Corp., are being reduced and are better matched between pins.

Thus, a need exists to reduce parasitic capacitance in order to make full use of the faster speeds at which current devices can operate and to reduce the power required to drive them.

SUMMARY OF THE INVENTION

A method of reducing parasitic pin capacitance in an integrated circuit having three or more metal levels is provided. The method comprises forming a bond pad that is at least partially exposed at the top surface of the integrated circuit, forming a metal pad on the metal level just below the bond pad and forming an underlying metal pad on each of the one or more lower metal levels, such that the ratio of an area of at least one of the underlying metal pads is substantially less than the area of the bond pad. Additionally, the metal pad on the metal level just below the bond pad may have an area less than the area of the bond pad.

Accordingly, parasitic capacitance is effectively reduced by the increased dielectric thickness between a bond pad and underlying conductive regions. Two or more interlevel dielectric layers are formed over a substrate. A bond pad is formed in the topmost metal level on the top surface of the topmost interlevel dielectric layer, such that the bond pad is at least partially exposed at the top surface of the integrated circuit. Two or more metal pads are formed at the interfaces of the two or more interlevel dielectric layers and at the bottom surface of the bottommost interlevel dielectric layer. The two or more metal pads have connections to the integrated circuit, and at least the one of the metal pads below the top two pads has an area less than the area of the bond pad. Conductive connections are formed between the bond pad and the two or more metal pads.

Adjacent metal levels are separated by interlevel dielectric layers. Conductive contacts are formed between the bond pad, the metal pad on the metal level below the bond pad and the one or more underlying metal pads to form a low resistance connection. The conductive contacts may comprise vias filled with conductive material, preferably metal. The method can be used with bond pads configured for ball bonding, wedge bonding, flip chip bonding or any other bonding technology that uses bond pads.

In another aspect of the invention, an integrated circuit semiconductor device having a bonding pad region of a multi-layered wiring structure is provided. The structure has metal pads on at least three wiring layers, and the metal pads are in electrical contact with one another. There is an uppermost wiring layer, with a metal bond pad capable of making electrical connections outside the device, on a top surface of an uppermost ILD layer. There is a metal pad in the lowermost wiring layer over a planarized insulator that covers active devices, and the metal pad has an area substantially less than (preferably<30% of) the area of the bond pad in the uppermost wiring layer. Metal pads in wiring layers between the lowermost wiring layer and the uppermost wiring layer may each have an area less than the metal bond pad in the uppermost wiring layer.

According to yet another aspect of the invention, a bonding element of a multi-layered wiring structure is configured to reduce parasitic capacitance in an integrated circuit. The bonding element comprises a metal bond pad at least partially exposed at a top surface of an integrated circuit, at least two underlying metal pads at different levels below the bond pad There are a sufficient number of interlevel dielectric layers to intervene between adjacent underlying metal pads and between the bond pad and an adjacent metal pad, and there are conductive connections between the bond pad and the at least two underlying metal pads. The ratio of the area of a bottommost underlying metal pad to the area of the bond pad is preferably less than 30%. Preferably the metal bond pad is solid and continuous, and the bottommost underlying metal pad has some regions with no metal, into which regions a dielectric layer extends.

BRIEF DESCRIPTION OF THE DRAWINGS

The figures are schematic in nature and have not been drawn to scale.

DETAILED DESCRIPTION OF THE PREFERRED EMBODIMENT

Figure 1:
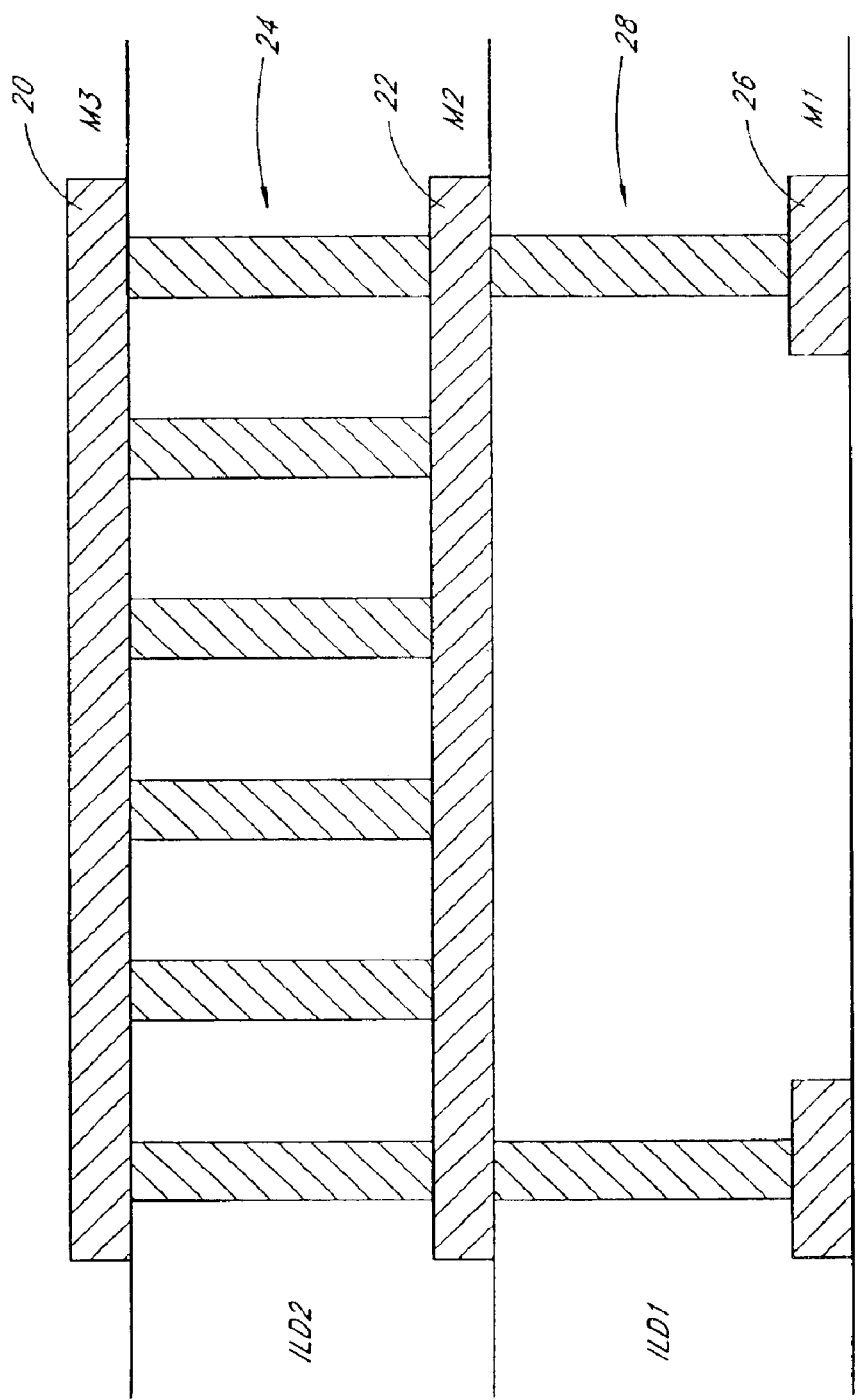
FIG. 1 is a cross section of a metal pad structure that reduces parasitic capacitance for a three-level metallization according to an illustrated embodiment of the current invention.

Electrical contacts must be made to integrated circuits, or chips, to make them of use within a larger electrical circuit, such as on a circuit board. These contacts are made through bond pads. Bond pads are metal areas connected to devices within the chip. Wires are attached to the bond pads to connect them to the external pins of the completed integrated circuit package. Conventional bonding technology requires that bond pads be relatively large in order to make the wire attachment.

Within the chip, bond pads have electrical connections to inner metallization layers. These connections route electrical signals from the outer bond pads to the inner portions of the integrated circuit and vice versa.

Some bonding processes require relatively high pressures to make good connections between the wire and the bond pad. The force on the bond pad produces mechanical stresses in the underlying dielectric layers and can cause cracks to develop in these layers. To mitigate the stress, underlying structures of various types have been developed to reinforce the bond pads. Examples of these can be found in the prior art in U.S. Pat. No. 5,288,661 (Satoh et al.), U.S. Pat. No. 5,502,337 (Nozaki), U.S. Pat. No. 5,736,791 (Fujiki et al.), U.S. Pat. No. 6,143,396 (Saran et al.) and U.S. Pat. No. 6,207,547 (Chittipeddi et al.). This problem has become even more difficult as the industry has moved toward using lower k dielectrics, as many of these have less mechanical strength than conventional dielectrics and, therefore, are more subject to cracking. Many of the past innovations in metallization structures related to bond pads have been made in response to these problems.

Parasitic capacitance can occur anywhere in an integrated circuit where conducting areas are separated by insulating material. Parasitic capacitance is detrimental to the performance of the integrated circuit because it adds delay to signals. As discussed above, to a first order, capacitance is directly proportional to the areas of the conducting regions (plates) and inversely proportional to the distance separating the conducting regions.

In current technologies, where most device features are submicron in size and conducting line widths can be as small as 0.11 µm, the bond pad size is relatively very large. Bond pads and underlying metal pads associated with them are usually fabricated around the periphery of a chip and are conventionally on the order of 100 µm by 100 µm, about 1000 times larger than other conducting features. It has been difficult to reduce the size of bond pads because of the basic physical constraints of current bonding technology. Bond pads must be large enough to accommodate the bonding process, wherein a wire is attached to the pad using ball bonding or wedge bonding or by joining solder bumps on the bond pads to the substrate for flip-chip bonding.

Generally, external or top level bond pads have electrical connections to internal bond pads, which are, in turn, connected to metallization structures at each metal level within the chip. Together the bond pads can form very large parallel plate capacitors with each other, resulting in large parasitic capacitance. "Pad capacitance" arising from these structures can make an overwhelming contribution to the overall input pin capacitance.

The illustrated embodiments of the current invention provide ways to reduce parasitic capacitance by reducing the areas of metal pads at lower metal levels. Moreover, the embodiments of this invention derive much capacitance reduction by increasing the effective distance, d, between conducting regions that comes about as a result of reducing the bond pad size at lower metal levels.

These and other objects and advantages of the present invention will become more fully apparent from the following description taken in conjunction with the accompanying drawings. Reference will now be made to the drawings wherein like numerals refer to like parts throughout.

FIG. 1 shows a cross section cut near the center of a metal pad structure for an integrated circuit with three metal layers, M1, M2, M3 in accordance with an illustrated embodiment. It shall be understood that the term "metal layer" as used herein may actually comprise multiple films. These films include not only the metal layer used for electrical conduction, such as aluminum or copper, but also additional films that are deemed to be desirable for fabrication or functioning of the integrated circuit. These may include, but are not limited to, conductive anti-reflective coatings, diffusion barriers, capping layers, etch-stop layers.

Each pair of metal layers is separated by a layer of interlevel dielectric (ILD). It will be understood that ILD, as used here comprises all insulating layers between metal levels including dielectric capping layers, etch-stop layers, diffusion barrier layers, chemical-mechanical planarization-stop layers, etc., in addition to the actual dielectric layer itself. It will be further understood that there can be additional insulating layers within the integrated circuit, such as below M1 or over the topmost metal layer. But the term interlevel dielectric or ILD will be reserved only for insulating layers between metal layers.

There is an external or top metal bond pad 20 at M3. The terms external or top bond pad are used to mean only the metal pad in the uppermost metal layer that can be connected to outside circuits. There may be at least one additional insulating layer (not shown), typically referred to as a passivating layer, over M3. Any layer over the topmost metal layer M3 contains an opening that allows the external bond pad 20 to be at least partially exposed at the top surface of the integrated circuit. ILD1 intervenes between M1 and M2, and ILD2 intervenes between M2 and M3. Conventionally, the external bond pad 20 has an approximately square shape, although it may have any shape consistent with the art of integrated circuit manufacture. An exemplary bond pad is solid and continuous and measures approximately 100 µm by 100 µm.

The bond pad 20 is connected to an internal bond pad, referred to herein as metal pad 22, at M2 through plugs or contacts 24, which are vias filled with conductive material, preferably metal. Conventionally, metal pad 22 is also solid and continuous, fits within a footprint of the bond pad and has the same size and shape as the bond pad. Footprint of the external bond pad is used here to mean the invariant projection of the outline of the external bond pad onto another layer. Metal pad 22 connects to metal lines in M2, which, in turn, connect to individual devices within the chip. For the embodiments of the current invention, metal pad 22 may have a conventional configuration or it may have a reduced area as compared to the bond pad 20.

The metal pad 22 makes contact to a reduced-area lower metal pad 26 at M1 through conductive contacts 28, preferably metal. The lower metal pad 26 has an area substantially less than the area of the external bond pad 20. Preferably, the metal pad 26 has an area less than 30% of the area of the bond pad 20, more preferably, less than 20% and, most preferably, less than 10%.

A number of exemplary configurations for the reduced-area metal pad 26 are shown in FIG. 2. The smaller the area of metal pad 26, the greater the reduction in parasitic capacitance. At the same time, metal pad 26 must be large enough to conduct electricity and to make an electrical connection to a contact in a via.

In one aspect of the invention, metal pads (a–d), as shown in FIG. 2, are basically square around their outer edges and match the footprint of a typical bond pad. In another aspect of the invention, the metal pads can have any outer shape, such as a round shape and may have outer edges that fit within the footprint of the bond pad. It will be understood that the areas not containing metal in these metal pads are filled with dielectric material, preferably projections of the insulating layer either directly below or directly above the metal layer containing the metal pad.

Regardless of their outer shape, all metal pads in FIG. 2 contain metal with openings therein. There are no specific limitations on the shape or configuration of the openings in the metal pads. The openings occupy a sufficient area that the remaining metal area is less than the area of the metal bond pad in the uppermost metal layer. The illustrated metal pads have a metal area less than 50% of the area of the bond pad. Preferably, the metal pads have a metal area less than 30% of the area of the bond pad, more preferably, less than 20%, most preferably, less than 10%.

Preferably a metal pad and the openings therein are fabricated as part of the metal layer in which the metal pad lies. For conventional metallizations, this comprises depositing a metal layer onto an insulating layer (for M1) or onto an ILD layer (for M2–M(n)) and then patterning and etching, as is known in the art. In this case, the metal pad lies on the top surface of the underlying insulating or ILD layer without extending into the layer. Subsequent deposition of either ILD (for M1–M(n−1)) or an overlying passivation layer (for M(n)) fills in the regions where metal had been removed during etch, including any openings in the metal pads.

For dual damascene metallizations, before metal deposition, the pattern for the metal lines and metal pads is etched into an insulating or ILD layer, as is known in the art. Metal is deposited to overfill the etched out regions, and the excess metal is removed, usually through chemical-mechanical planarization. Thus, a network of metal lines and metal pads remains embedded in the underlying insulating or ILD layer. The openings in the metal pads contain unetched material from the underlying insulating or ILD layer. Subsequently, either ILD (for M1–M(n−1)) or an overlying passivation layer (for M(n)) is deposited over the planarized surface.

If there is a substantially large opening in the metal pad, such as in FIGS. 2(a,b), there may be a problem with dishing during chemical-mechanical planarization of ILD layers. Thus, for dual damascene metallizations, it may be useful to reduce metal pad area with a number of smaller openings or to include small metal areas within a large opening. While larger openings reduce plat capacitance to a greater extent, the skilled artisan will understand that a tradeoff is made between minimizing the parasitic capacitance of the structure and maximizing the flatness of ILD layers after chemical-mechanical planarization.

The methods of the current invention can be applied equally well to various metallization schemes. For conventional metallizations, the bottom surface of a metal pad lies in the same plane as the upper surface of an underlying insulating or ILD layer. As discussed above, the ILD layer may actually comprise a number of insulating layers. The top surface of the metal pad is embedded within an overlying ILD or insulating layer. For dual damascene metallizations, the bottom surface of the metal pad is embedded within an underlying insulating or ILD layer, and the top surface of the metal pad is in the same plane as the lower surface of an overlying ILD or insulating layer. When any portion of a metal pad intersects the interface of adjacent insulating or ILD layers, it can be said that the metal pad has been formed at the interface of adjacent layers, even if the bulk of the metal pad lies mostly within one of the layers. Similarly, when it is said that a metal pad lies at a bottom surface of an ILD layer, the bulk of the metal pad may lie within the ILD layer or may extend into an underlying layer adjacent to the ILD layer.

Figure 3:
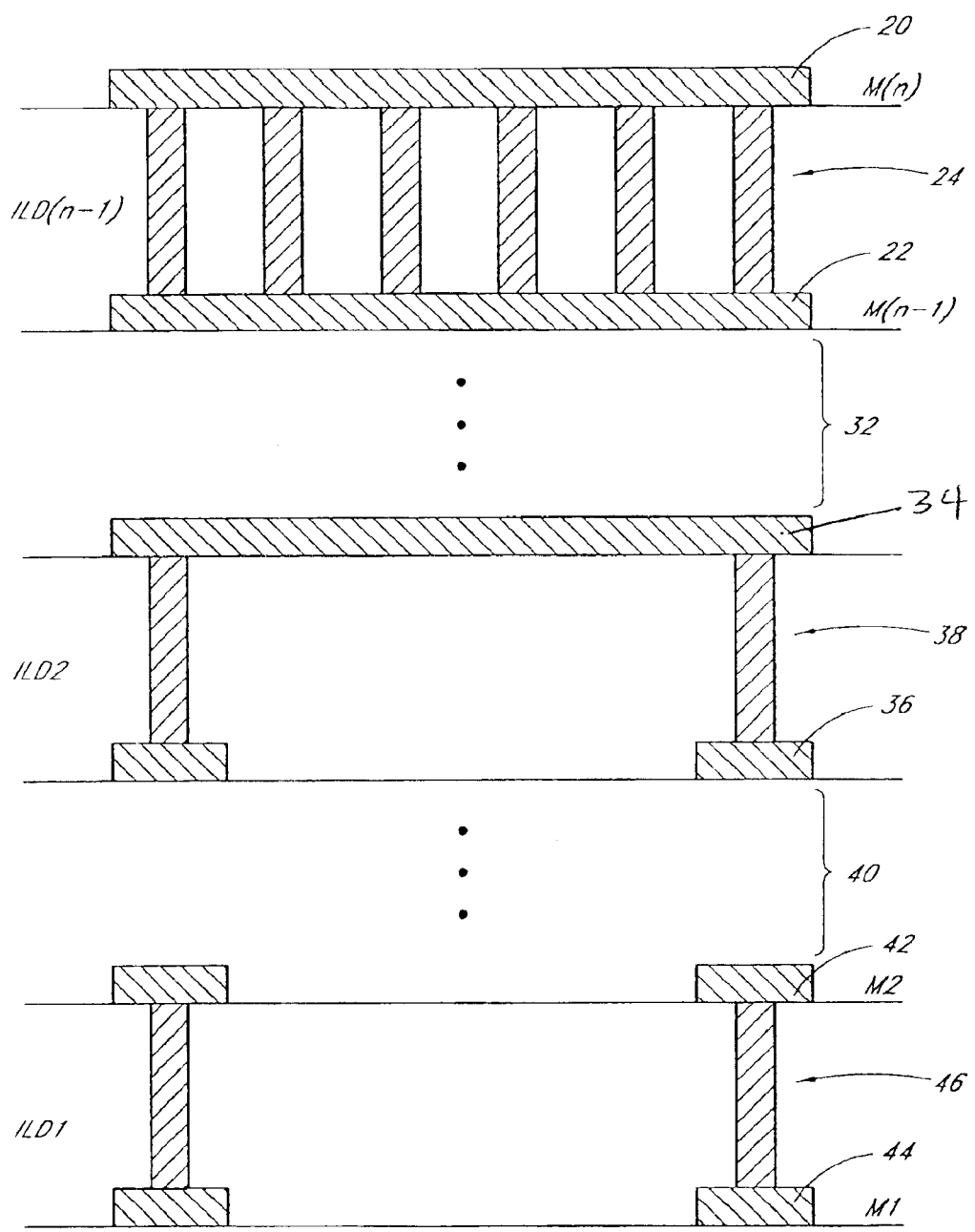
FIG. 3 is a cross section of an n-level wiring structure that reduces parasitic capacitance according to an illustrated embodiment of the current invention.
Figure 3:

A generalized, illustrated embodiment is shown in FIG. 3. This is a cross section of the bonding elements of a multi-layered wiring structure having n metal layers and configured to reduce parasitic capacitance arising from this structure. As discussed above, pad capacitance makes a substantial contribution to the overall parasitic capacitance of the chip, which can be measured as pin capacitance. As is the convention in semiconductor processing, the bottommost metal layer, that is, the first metal layer deposited onto the wafer during processing, is designated M1 (metal 1). The metal layer above M1 is M2. We will refer to the topmost layer in an n-layer process as M(n) and to the layer just below M(n) as M(n−1). There are n−1 interlevel dielectric layers, designated ILD1–ILD(n−1) that separate the metal layers and an additional insulating layer 30 below M1.

In the illustrated embodiment of FIG. 3, the bond pad 20 is shown at metal layer M(n) over dielectric layer ILD(n−1). The bond pad 20 comprises a solid and continuous metal layer. There may be at least one additional insulating or passivation layer (not shown) over M(n). Any layer over the topmost metal layer M(n) contains an opening that allows the bond pad 20 to be at least partially exposed at the top surface of the integrated circuit.

As was shown in FIG. 1, metal pad 22 on metal layer (n−1) is aligned directly below the bond pad 20, that is, it lies entirely within a footprint of the bond pad 20 on metal layer (n−1). Alternatively, metal pad 22 may not be aligned with the bond pad 20. Metal pad 22 may lie only partially within the footprint of the bond pad 20 or it may lie outside the footprint altogether. Metal pad 22 and the bond pad 20 are electrically connected to one another through contacts 24 comprising vias filled with conducting material. Metal pad 22 may be solid and continuous as is suggested in this view, or it may have a reduced area relative to the bond pad 20, as described below for the lower level metal pads.

The dots 32 shown between metal pad 22 and metal pad 34 indicate a region wherein any number of metal layers and interlevel dielectric layers may intervene. Metal pad 34 and each metal pad within region 32 may be solid and continuous or may have a reduced area relative to bond pad 20. The metal pads are connected to one another electrically through vias filled with conducting material, preferably metal.

Metal pad 34 is connected to another lower metal pad 36 on the next lower metal layer through contacts 38. The illustrated metal pad 36 has an area less than 50% of the area of the bond pad 20. Preferably, metal pad 36 has an area less than 30% of the area of the bond pad 20, more preferably, less than 20% and, most preferably, less than 10%.

The dots 40 indicate a region wherein any number of metal layers and interlevel dielectric layers may intervene between metal pad 36 and metal pad 42 at M2. Preferably, at least some of the metal pads on these intervening metal layers have areas less than the area of the bond pad 20.

Metal pad 42 at metal layer M2 is connected to a bottommost metal pad 44 at metal layer M1 through contacts 46. The metal pad 44 may have an area less than 50% of the area of the bond pad 20. Preferably, the metal pad 44 has an area less than 30% of the area of the bond pad 20, more preferably, less than 20% and, most preferably, less than 10%.

Metal layers M2–M(n−1) are formed at the interfaces of the interlevel dielectric layers. As discussed above, each metal layer may actually comprise a stack of conducting layers and each ILD can compromise a number of adjacent insulating layers. Metal layer M1 is formed below the first interlevel dielectric layer ILD1 at the interface of ILD1 with the underlying insulating, or dielectric, layer 30. As discussed above, the term ILD is reserved only for insulating layers between metal layers. Thus, insulating layer 30, which lies between M1 and the substrate, is not an ILD. Metal layer M(n) is formed over the topmost interlevel dielectric layer ILD(n−1). The bond pad 20 and underlying metal pads are each formed within a metal layer. The metal pads are formed at interfaces of ILD layers or at the interface of a bottommost ILD layer (ILD1) and an underlying insulating layer, and the bond pad is formed at the top surface of a topmost ILD layer.

For n=3, the bonding element structure of FIG. 3 contains only three metal layers and becomes the same as the structure of FIG. 1. M(n) becomes M3, M(n−1) becomes M2, and M1 is still M1. The other layers shown in FIG. 3, that is, including features 32 through 42 are not present. In the preferred embodiments, n equals five or six, but ultimately n can be as large as is technologically possible.

The substrate 12 and an intervening insulating layer 30 lie below the bottommost metal pad 44 on metal layer M1. The term substrate, as used here, can include any device or conductive structure that has been fabricated on the wafer prior to deposition of M1. The intervening insulating layer 30 is often thicker than the interlevel dielectric layers between metal layers to make room for devices on the substrate.

FIG. 3 illustrates only the bonding pad region of a chip. Devices have been fabricated within other regions of insulating layer 30 that cannot be seen in this view. The intricate structures of active devices such as memory cells, stacked capacitors or transistors generally require more vertical space that simple metal layers. Thus, insulating layer 30 is generally thicker than the interlevel dielectric layers in order to isolate these structures and to provide a flat surface over them on which a metal layer can be deposited. The greater thickness of insulating layer 30 can be used to advantage in effecting capacitance reduction.

Figure 4A:
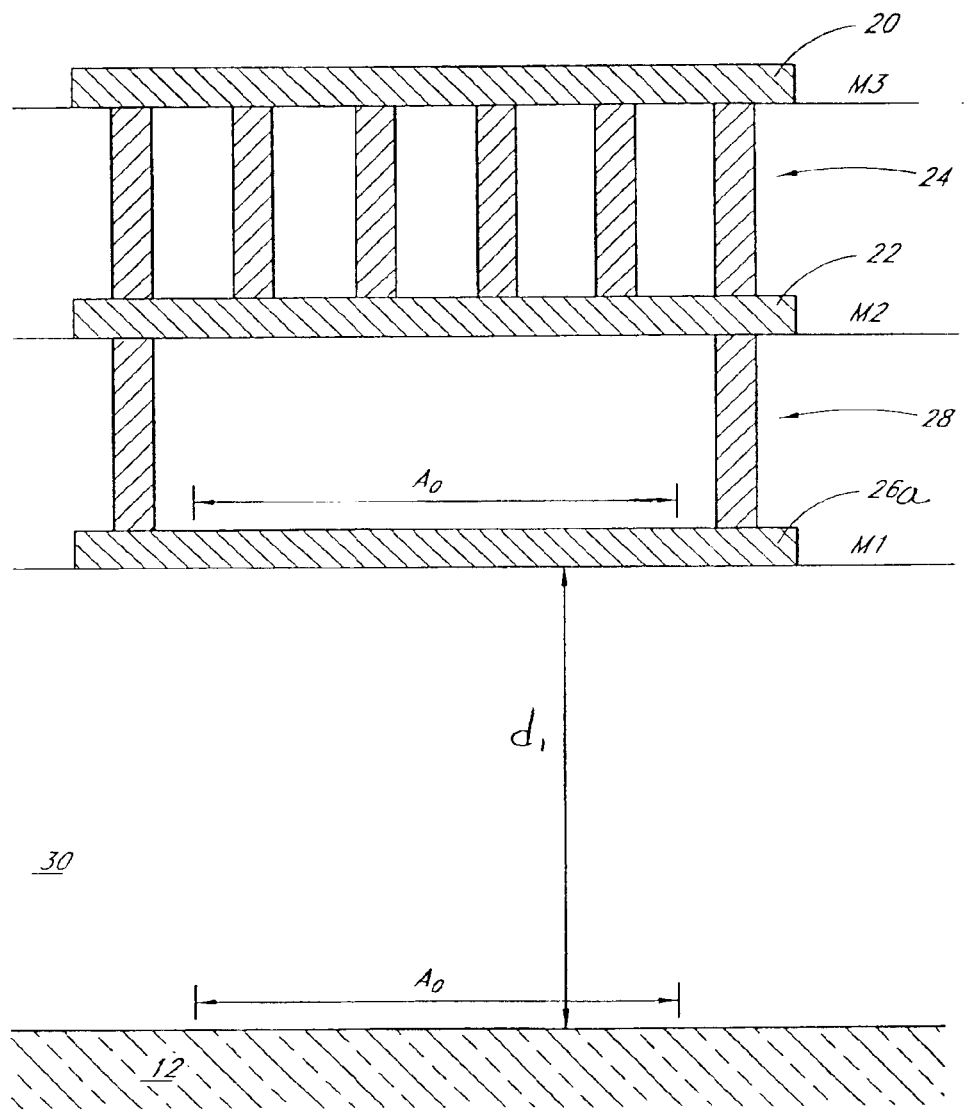
FIGS. 4A and 4B show cross sections of two different metal pad structures for a three-level metallization and how improvements in parasitic capacitance can be made according to an illustrated embodiment of the current invention.
Figure 4B:
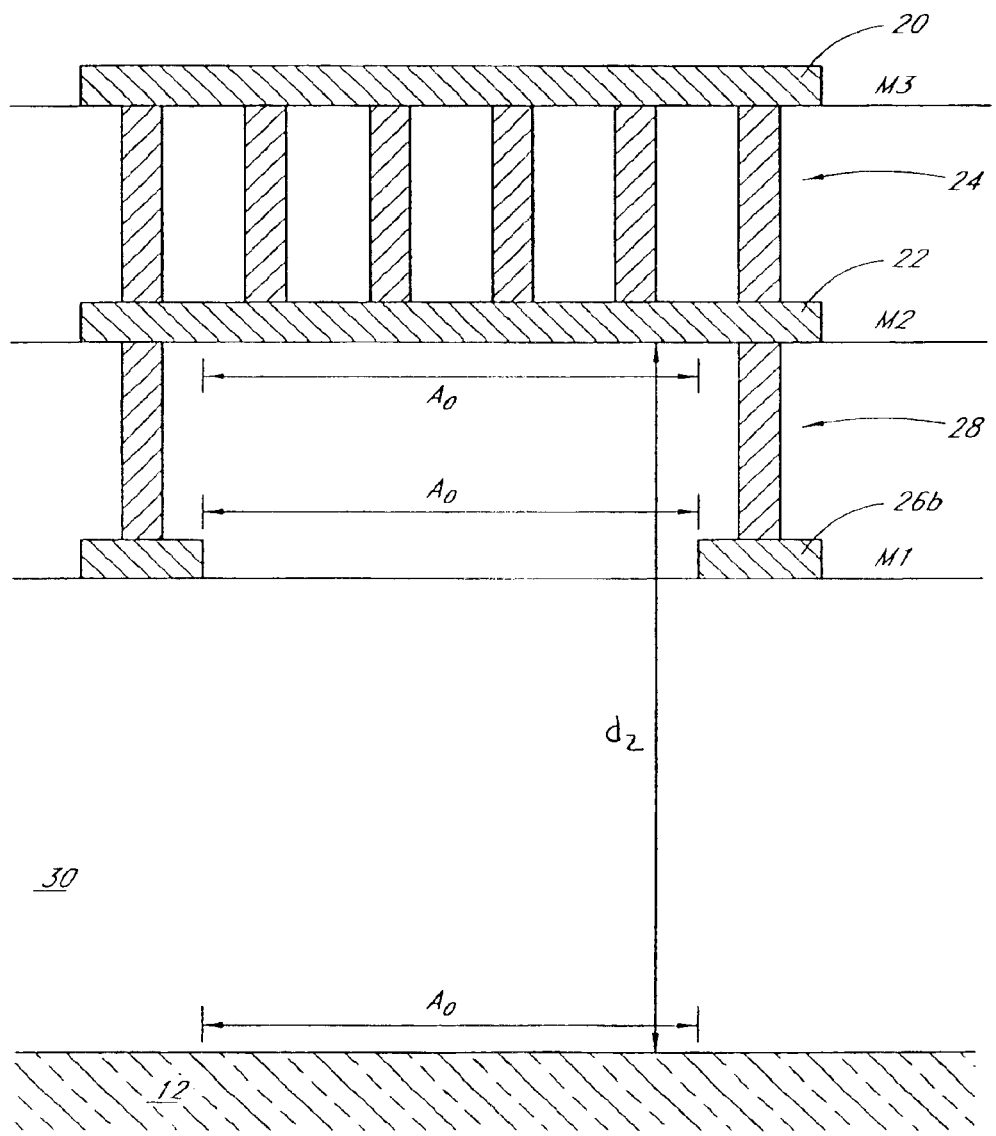

FIGS. 4A and 4B serve to provide a more clear understanding of how capacitance reduction can be achieved. These figures show cross sections cut near the centers of metal pad structures for integrated circuits with three levels of metallization, M1, M2, M3. Each pair of metal layers is separated by a layer of ILD.

FIGS. 4A and 4B are identical in the following ways. The metal pad structures are formed over a substrate 12. As described above, with respect to FIG. 3, the term substrate includes any conductive structure or region that has been fabricated on the wafer. An insulating layer 30 intervenes between the substrate 12 and the first metal layer M1. Metal pad 20 at M3 is a bond pad of the integrated circuit 10. The bond pad 20 is connected to metal pad 22 at M2 through contacts 24 that are vias filled with conductive material, preferably metal. The metal pad 22 makes contact to a metal pad at M1 through contacts 28. It is in the configuration of the metal pad at M1 that FIGS. 4A and 4B differ.

These illustrations compare the capacitance of the structure in FIG. 4A with the capacitance of the structure in FIG. 4B. This illustration focuses on comparing the capacitance, over identical areas $A_0$, between the bottommost metal pad, 26a for FIG. 4A and 22 for FIG. 4B, and substrate 12 for the two structures.

In FIG. 4A, for purposes of this example, the metal pad 26a at M1 is a solid, continuous metal pad. Thus, the parasitic capacitor of interest has parallel plates at metal pad 26a and the substrate 12; separated by a distance $d_1$. The capacitance $C_A$ from the plate area $A_0$ between metal pad 26a and substrate 12 for FIG. 4A can be described by the equation:

$$C_A = \frac{k\varepsilon_0 A_0}{d_1}, \quad (2)$$

wherein $C_A$ is the parasitic capacitance from the structure in FIG. 4A, k is the dielectric coefficient of the material between the plates, $\varepsilon_0$ is the permittivity of free space, $A_0$ is the plate area and $d_1$ is the distance between the plates formed by metal pad 26a and substrate 12.

Figure 2B:
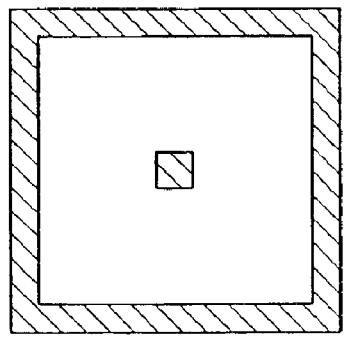
FIGS. 2(a) to 2(d) are schematic top views showing some possible configurations for a metal pad with reduced area.
Figure 2D:
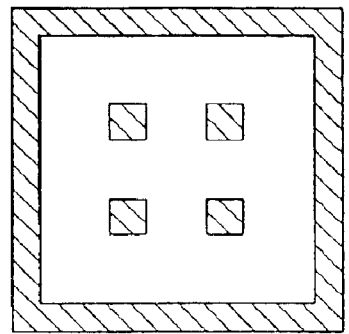
Figure 2A:
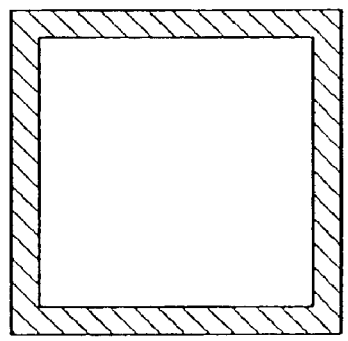
Figure 2C:
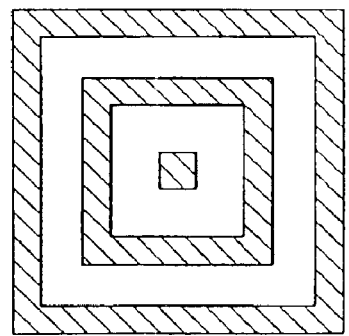

In FIG. 4B, the metal pad 26b is a square ring, like the one shown in FIG. 2(a), with an inside opening $A_0$. The parasitic capacitor of interest is between metal pad 22 and substrate 12 over plate area $A_0$. It has parallel plates comprising metal pad 22 and substrate 12, separated by a distance $d_2$. The capacitance $C_B$ from the plate area $A_0$ between metal pad 22 and substrate 12 for FIG. 4B can be described by the equation:

$$C_B = \frac{k\varepsilon_0 A_0}{d_2}, \quad (3)$$

wherein $C_B$ is the parasitic capacitance from the structure in FIG. 4B, k is the dielectric coefficient of the material between the plates, $\varepsilon_0$ is the permittivity of free space, $A_0$ is the plate area and $d_2$ is the distance between the plates formed by metal pad 22 and substrate 12.

For FIGS. 4A and 4B, the ILD material and the insulating material in layer 30 are the same, so k is the same, $\varepsilon_0$ is the same and $A_0$ is the same, as we are considering capacitance over the same plate area $A_0$ for both figures. Thus in comparing plate capacitance, C, the only variable is the inverse of the distance d between the plates. This can be expressed as:

$$C \propto 1/d. \quad (4)$$

With reference to FIGS. 4A and 4B, in an exemplary embodiment and using typical ILD and insulator thicknesses, $d_1$ is 2.0 μm and $d_2$ is 2.7 μm. Using the expression for the proportionality given at (4) and the numbers above, the capacitance for the configuration in FIG. 4A is proportional to $1/d_1$ or 0.5, and the capacitance for the configuration in FIG. 4B is proportional to $1/d_2$ or 0.4. This shows about a 20% decrease in capacitance for FIG. 4B as compared to FIG. 4A.

As discussed above, wiring structures contribute largely to parasitic capacitance, and the capacitance discussed in reference to FIGS. 4A and 4B is one example of that. By applying the structures and methods disclosed to underlying or metal pads, substantial reductions in parasitic capacitance can be achieved.

For example, Intel requires a maximum pin capacitance of 2–5 pF in memory chips designed to work with their Pentium chipset. It is difficult to meet this requirement with current technologies wherein pin capacitance can be greater than 5 pF. The methods disclosed herein help reduce the input capacitance and can be useful in meeting input capacitance specifications.

Hence, although the foregoing description of the preferred embodiments of the present invention has shown, described and pointed out the fundamental novel features of the invention, it will be understood that various omissions, substitutions and changes in the form of the detail of the apparatus as illustrated as well as the uses thereof may be made by those skilled in the art, without departing from the spirit of the present invention. Consequently, the scope of the present invention should not be limited to the foregoing discussion, but should be defined by the appended claims.

We claim:

1. An integrated circuit semiconductor device having a bonding pad region of a multilayered wiring structure, comprising:

at least n, where n ≧3 wiring layers in electrical contact with one another, including an uppermost wiring layer at metal level M(n) and a lowermost wiring layer at metal level M1, and n−1 interlevel dielectric (ILD) layers, one ILD layer between every two wiring layers;

the uppermost wiring layer at metal level M(n), containing a metal bond pad capable of making electrical connections outside the device, and formed on a top surface of an uppermost ILD layer;

a second wiring layer at metal level M(n−1) including a solid metal pad underlying an entirety of the metal bond pad; and the lowermost wiring layer at metal level M1, containing a metal pad having an area less than 30% of an area of the metal bond pad, and formed at a bottom surface of a lowermost RD layer.

2. The integrated circuit semiconductor device of claim 1 wherein wiring layers between the lowermost wiring layer at M1 and the wiring layer at M(n−1) each contains a metal pad having an area less than the metal bond pad in the uppermost wiring layer at metal level M(n).

3. The integrated circuit of claim 1 wherein n equals five.

4. The integrated circuit of claim 1 wherein n equals six.

5. A bonding element of a multilayered wiring structure configured to reduce parasitic capacitance in an integrated circuit, comprising:

a metal bond pad at least partially exposed at a top surface of an integrated circuit;

at least two underlying metal pads at different levels below the bond pad wherein a ratio of area of a bottommost underlying metal pad to area of the bond pad is less than 50%, wherein one of the metal pads between the metal bond pad and the bottommost underlying metal pad is a solid layer configured to support the overlying metal bond pad, the solid layer underlying all of the bond pad;

a sufficient number of dielectric layers to intervene between each adjacent pair of the underlying metal pads and between the bond pad and an adjacent metal pad; and conductive connections between the bond pad and the at least two underlying metal pads.

6. The bonding element of claim 5 wherein the ratio of the area of the bottommost underlying metal pad to the area of the bond pad is less than 30%.

7. The bonding element of claim 5 herein the ratio of the area of the bottommost underlying metal pad to the area of the bond pad is less than 10%.

8. The bonding element of claim 5 therein the metal bond pad is solid and continuous.

9. The bonding element of claim 5 herein the bottommost underlying metal pad has an outer perimeter that fits within a footprint of the bond pad.

10. The bonding element of claim 9 wherein the bottommost underlying metal pad has some regions with no metal, into which regions a dielectric layer extends.

11. The bonding element of claim 10 wherein the metal pad is a ring.

12. The bonding element of claim 5 therein the conductive connections between the bond pad and the at least two underlying pads are only around the perimeter of the bond pad.

13. The bonding element of claim 5 wherein the conductive connections comprise vias filled with electrically conductive material.

14. The bonding element of claim 5 wherein the solid layer configured to support the overlying bond pad is connected to the overlying bond pad by a greater number of conductive connections than the electrical connections connecting the solid layer to other underlying layers.

* * * * *

UNITED STATES PATENT AND TRADEMARK OFFICE
CERTIFICATE OF CORRECTION

PATENT NO.   : 6,909,196 B2
DATED         : June 21, 2005
INVENTOR(S) : Batra et al.

It is certified that error appears in the above-identified patent and that said Letters Patent is hereby corrected as shown below:

Column 9,
Line 17, after "3" insert -- , --.
Line 33, delete "RD" and insert -- ILD --.

Column 10,
Lines 19 and 24, delete "herein" and insert -- wherein --.
Lines 22 and 32, delete "therein" and insert -- wherein --.

Signed and Sealed this

Ninth Day of May, 2006

JON W. DUDAS
*Director of the United States Patent and Trademark Office*